United States Patent
Alphonse et al.

(10) Patent No.: US 6,363,088 B1
(45) Date of Patent: *Mar. 26, 2002

(54) ALL SOLID-STATE POWER BROADBAND VISIBLE LIGHT SOURCE

(75) Inventors: Gerard Argant Alphonse; Herschel Clement Burstyn, both of Princeton; Leon Shapiro, Lawrenceville, all of NJ (US)

(73) Assignee: Sarnoff Corporation, Princeton, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/201,032

(22) Filed: Nov. 30, 1998

(51) Int. Cl.$^7$ .................................................. A01S 3/30
(52) U.S. Cl. ................................ 372/6; 372/70; 372/99
(58) Field of Search ................................ 372/6, 23, 99, 372/22; 359/328, 332, 341, 345

(56) References Cited

U.S. PATENT DOCUMENTS

| | | | |
|---|---|---|---|
| 4,789,881 A | | 12/1988 | Alphonse |
| 4,958,355 A | | 9/1990 | Alphonse et al. |
| 5,166,948 A | | 11/1992 | Gavrilovic et al. |
| 5,182,759 A | * | 1/1993 | Anthon ........................ 372/72 |
| 5,191,586 A | * | 3/1993 | Huber ........................ 372/102 |
| 5,436,919 A | * | 7/1995 | Chwalek ........................ 372/7 |
| 5,486,947 A | * | 1/1996 | Ohishi et al. .................. 372/6 |
| 5,621,749 A | * | 4/1997 | Baney ........................ 372/69 |
| 5,684,621 A | * | 11/1997 | Downing .................... 359/326 |
| 5,930,029 A | * | 7/1999 | Mehuys ........................ 372/6 |

OTHER PUBLICATIONS

International Search Report for International (PCT) Application No. PCT/US99/28224 dated Apr. 18, 2000.

* cited by examiner

*Primary Examiner*—Teresa M. Arroyo
*Assistant Examiner*—Gioacchino Inzirillo
(74) *Attorney, Agent, or Firm*—William J. Burke

(57) ABSTRACT

An optical system for generating light includes a doped fluoride fiber which is used to convert energy of light at a first frequency, supplied by an optical pump, to light at a second frequency. The second frequency may be lower (down-conversion) or higher (up-conversion) than the first frequency. The optical pump is coupled to the doped fiber. A reflector may be placed at each facet of the doped fiber to form a laser cavity. The reflectors at the facets of the fiber are tuned to a desired emission frequency of the fiber. The laser cavity may be formed either by two substantial reflectors, each positioned at a facet of the doped fiber, or by a substantial reflector, positioned at one facet of the fiber, and a partial reflector, positioned at the other facet of the fiber. When two substantial reflectors are used, other means, such as a wavelength division multiplexer or diffraction grating may be provided in the laser cavity fiber, to provide an output path for the light at the second frequency. For example, the optical system may be used to generate laser light in image projection systems. In particular, the optical system may be used to produce laser light at three primary colors of the visible spectrum, such as, red, green, and blue wavelengths. An optical system with a broad emission spectrum may also be formed by co-directional or contra-directional pumping of a doped fiber. For broad band emission a reflector may placed at one facet the doped fiber and the second facet is ground at an angle so that a laser cavity is not formed.

18 Claims, 4 Drawing Sheets

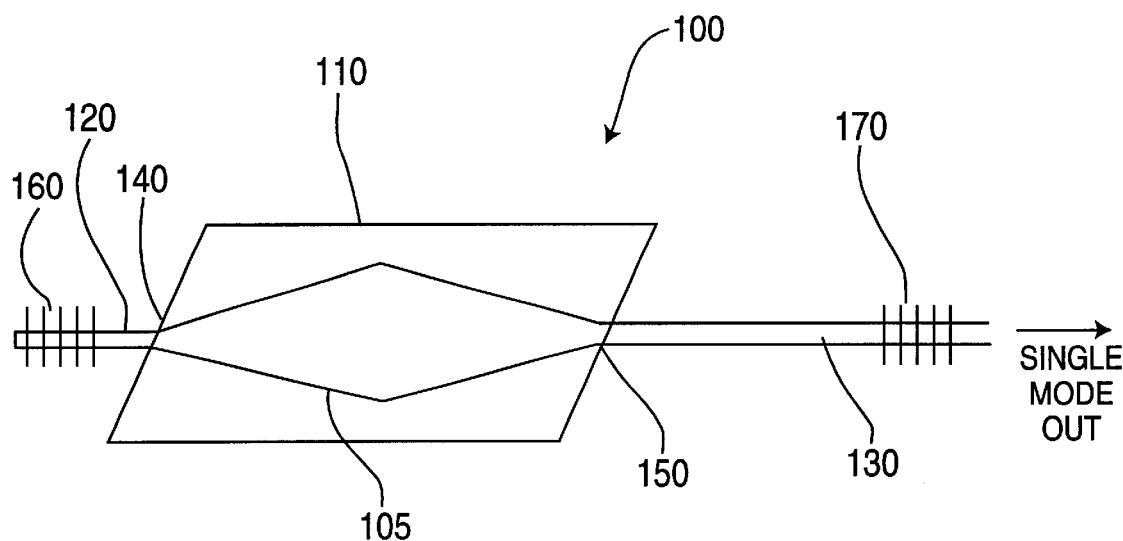
FIG. 1
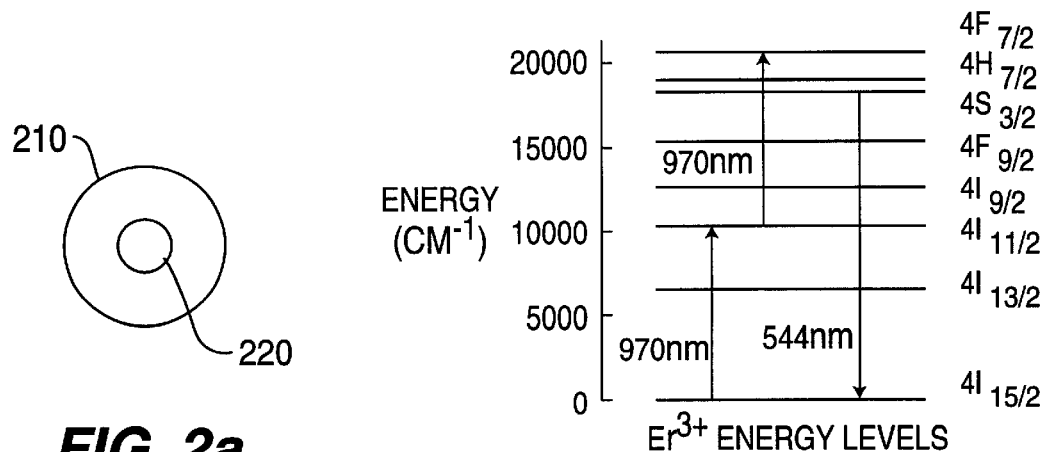
FIG. 2a
FIG. 2b
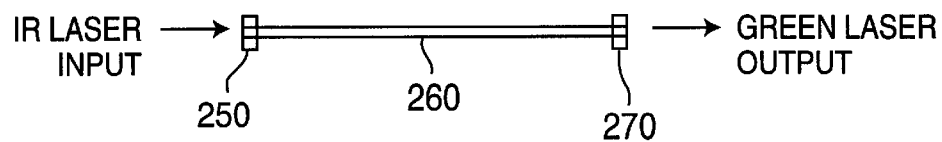
FIG. 2c

ALL SOLID-STATE POWER BROADBAND VISIBLE LIGHT SOURCE

FIELD OF THE INVENTION

The present invention relates to laser light sources, and, more particularly, to frequency conversion in optical fibers using a laser as an optical pump source.

BACKGROUND OF THE INVENTION

Systems such as image projection systems, for example, would benefit from compact, high luminous efficacy, long life, and narrow divergence angle light sources. Present short gap arc sources (gap length 1 mm to 1.8 mm) consume 100 to 270 watts of electrical power, with luminous efficacy of 2 to 5 lumens/watt in projection systems. The life time of these devices is on the order of 50 to 10,000 hours.

Semiconductor lasers are relatively small, with emission areas on the order of 5 μm×1 μm, and beam divergence angles of approximately 12° for the 5 μm dimension, and 40° for the 1 μm dimension. These semiconductor devices may have optical conversion efficiencies in excess of 50%. The high conversion efficiency gives these devices a luminous efficacy that is 5 to 10 times that of the arc sources in projection systems. Further, low beam divergence angles allow for higher collection efficiency by condenser lenses. As a result, a total of only a few watts from such a laser source may be sufficient for a projection system. A single single-mode semiconductor light source typically provides less than one watt of output power. Several of these devices, however, may be fabricated in a single step as a closely spaced monolithic array to provide the power for a projection system.

Presently direct band gap (low-cost) semiconductor lasers, with sufficient power, are only available in the wavelengths corresponding to red and infra-red, using a III-V compound material (typically based on gallium arsenide or indium phosphide). Direct band gap lasers for wavelengths corresponding to blue and green may require the use of II-VI gallium nitride-based material, but these devices are currently unable to provide sufficient power at room temperature. Several methods to make blue and green lasers are being studied. These typically involve up-conversion of semiconductor infra-red lasers.

There are currently two methods for generating blue and green light by frequency up-conversion. The first method uses a rare-earth-doped crystal to double the frequency of the laser light beam. Power levels as high as 3 watts have been obtained by this method in the green wavelengths (≈532 nm), and as high as 0.5 watt in the blue wavelengths (≈457 nm). It may be difficult, and therefore costly, to mass produce laser light sources according to this method. Moreover, the light sources produced by this method may be inefficient and may not operate well at room temperature.

The second method is a two-photon process in certain phosphors. Red, green, and blue light have been generated using a two-photon process by pumping appropriately doped phosphors using light at 980 nm. This method may have relatively low conversion efficiency, and may not produce relatively high visible power in small areas. Furthermore, the resulting emission is Lambertian. Therefore, collection efficiency to a small light valve would be relatively small. This type of approach may be appropriate if the phosphor is embedded in the projection screen. In a configuration of this type, however, it may be difficult to maintain alignment between the projector and the screen, without the use of sensors on the screen and a feedback system.

SUMMARY OF THE INVENTION

The present invention is embodied in an optical system for generating light. A doped optical fiber is used for converting energy of light having a predetermined wavelength, supplied by an optical pump, to light having another wavelength. A first reflector is positioned at a first facet of the doped optical fiber, and a second reflector is positioned at a second facet of the doped optical fiber. The first and second reflectors selectively reflect light having the other wavelength.

According to one aspect of the invention, the optical system further comprises another optical fiber, and a third reflector. The second reflector couples a first facet of the other optical fiber to the second facet of the doped optical fiber. The first reflector substantially reflects light having the other wavelength and substantially transmits light having the predetermined wavelength. The second reflector partially reflects light having the other wavelength and substantially transmits light having the predetermined wavelength. The other optical fiber provides an optical path for light having the predetermined wavelength. The third reflector is positioned at the second facet of the other optical fiber. The third reflector substantially reflects light having the predetermined wavelength and substantially transmits light having the other wavelength.

According to yet another aspect of the invention, the optical system includes: an optical gain medium, first through fourth fibers, a first reflector, and a second reflector. The optical gain medium, has a first facet and a second facet, and provides light at a first frequency via its first facet to a first facet of the first fiber. The second fiber provides an optical path and converts energy of light at the first frequency to light at a second frequency. The first reflector is positioned at the first facet of the second fiber to couple a second facet of the first fiber to a first facet of the second fiber. The first reflector substantially reflects light at the second frequency. The third fiber provides an optical path for light at the first frequency and is coupled to the second facet of the optical gain medium. The second reflector is positioned at the second facet of the second fiber. The second reflector couples the first facet of the third fiber to the second facet of the second fiber and substantially reflects light at the second frequency. The fourth fiber is fused to the second fiber and provides an output path for light at the second frequency.

According to another aspect of the invention, the optical system further comprises another optical pump coupled to the doped optical fiber. The other pump also generates light a the predetermined wavelength. The optical pump is coupled to the optical fiber, adjacent to the first facet of the doped optical fiber, by a WDM (wavelength division multiplexer). The other optical pump is coupled to the optical fiber, adjacent to the second facet of the doped optical fiber, by another WDM.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 1 illustrates a configuration for a high power single mode laser using a segment of a single mode fiber as a mode filter;

FIG. 2(a) is a cross-sectional diagram of a fluoride fiber;

FIG. 2(b) is a quantum state energy diagram which is useful for describing a two photon optical conversion system;

FIG. 2(c) is a block diagram of a single-pass optical system for generating green light from an Er-doped fluoride fiber laser pumped by an IR source;

DETAILED DESCRIPTION

Figure 3:
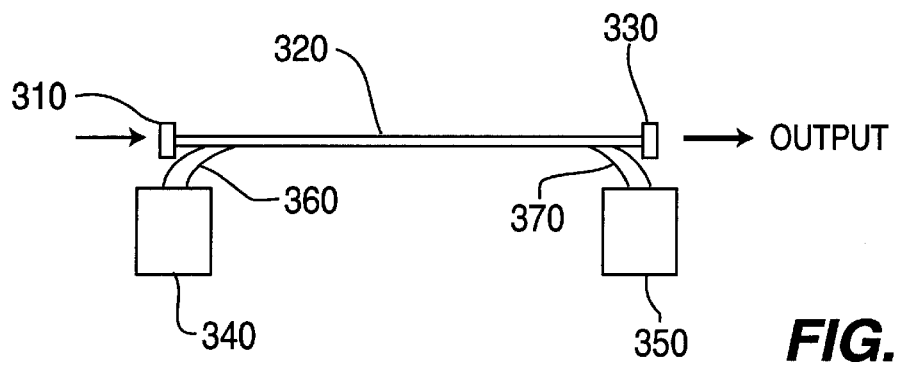
FIG. 3 is a block diagram of an optical system for generating light in accordance with one embodiment of the present invention.

A high power semiconductor laser may be constructed with a superluminescent diode (SLD), as described in patent application Ser. No. 09/158,847 filed on Sep. 23, 1998, titled HIGH POWER SEMICONDUCTOR LASER SOURCE. The superluminescent diode (SLD) may be used as a gain medium, and a length of single mode fiber with feedback may provide a desired single mode output characteristic. The high power SLD may operate free of parasitic feedback (facet reflection), and the fiber may function as a mode filter. Feedback may be applied, in the mode supported by the system, by arranging for reflection at the end of the fiber. It can be demonstrated that the SLD and single mode fiber with feedback structure functions as a laser with optical characteristics being precisely those of the fiber (mode filter). It can further be shown that an angled stripe SLD (as described in the above referenced patent application) may operate as the gain medium. The angled stripe SLD may operate free from parasitic facet reflection. A "diamond" SLD is such an angled stripe SLD that may operate as a high power gain medium. Feedback may be achieved by means of optical reflection. Optical reflection may be realized by a reflector attached to the end of the fiber, or by a grating which is fabricated on the fiber.

FIG. 1 illustrates an exemplary configuration for a high power single mode laser using a segment of a single mode fiber as a mode filter. Laser 100 includes a single or multiple element "diamond" SLD structure 105 with a mode expander (not shown). In the case of a multiple element structure, both multiple element "diamond" SLD structure 105 and the mode expander may be encased in a larger diamond structure 110 with two lengths (segments) of single mode fiber, 120 and 130, coupled to the outputs at the two facets, 140 and 150. Appropriate reflectors, 160 and 170, may be included in the fiber segments. The output dimensions of a tapered thick passive waveguide (not shown) may be constructed to enable coupling of over 80% of the available light in the fibers. If a single fiber is used, a suitable arrangement may be made to reflect light to the "diamond" through the face without using another fiber. Note that coupling a "diamond" to the fibers may be achieved with or without lenses. Using lenses, however, may provide higher coupling efficiency.

Reflection or optical feedback may be obtained, for example, by coating a fiber tip with a mirror or making a grating near the tip of a fiber. For the arrangement shown in FIG. 1, it is desirable for the reflector on the left 160 to have maximum reflectance, preferably close to 100%, and it is desirable for the reflector on the right (i.e. on the output end) 170 to have relatively low reflectance (typically 5–30%). Note that feedback is provided at the mode that can propagate in the fiber regardless of the number of modes that can propagate in the semiconductor structure. Thus, the arrangement shown in FIG. 1 is a high power single mode laser, with output power determined by the dimension of a single diamond or by the number of elements in "diamond" structure 110, and by beam parameters related to the fiber.

The overall dimensions of a chip for implementing an arrangement such as that of FIG. 1 would may be on the order of 0.5 mm×4 or 5 mm for a single diamond, and 2 to 3 mm×4 to 5 mm for a multiple diamond chip. Fabrication costs for such a chip may be relatively low, because a 3 inch diameter wafer may produce over 400 chips at a time.

Applications for such a high power single mode semiconductor laser include use in direct computer-to-plate printing, surgery, and as a pump for crystal and fiber frequency conversion light sources. In accordance with an embodiment of the present invention a class of frequency converters for optical fibers using a single mode laser as an optical pump source are described. The term "pump" refers to a source of energy operating at one frequency (including dc) or wavelength that may be used to generate, in a material, energy at another wavelength. Hence, energy at one frequency may be converted to energy at another frequency.

The energy conversion may be effected by a pump through interaction processes inherent in a material. Such interaction processes may be found in crystals such as lithium niobate and litihium tantalate, in certain polymer materials, and in rare-earth doped fibers, such as silica and ZBLAN-type fluoride fibers. Interaction processes in a material may be used to effect frequency conversion at both optical and IR wavelengths.

Both down-conversion, i.e. generation of light of longer wavelength than the operating wavelength of the pump, and up-conversion processes, i.e. generation of light of shorter wavelength than the operating wavelength of the pump, may be found in these materials. For example, energy from a pump operating at a wavelength of 980 nm may be injected at one end of a erbium-doped silica fiber to create a laser generating an output at a wavelength near 1100 nm (i.e. down-conversion). Another pump injecting energy at a wavelength of 850 or 976 nm into a praseodymium-doped fluoride fiber may be used to produce visible light, by up-conversion. In particular, light of red, green, and blue wavelengths, may be produced by an up-conversion process. Light of red, green, and blue wavelengths may be used for color displays and projectors.

State of the art light valve projection systems typically use arc lamps as their sources of light. Arc lamp light sources may consume several hundred watts of electrical power. Arc lamps may also have low efficacy (output lumens/electrical power input). For example, arc lamp sources may have efficacy on the order of 1.6 lumens per watt. Semiconductor lasers, however, have relatively high efficiency. A semiconductor laser may be configured in combination with a fiber to produce a relatively high-efficiency laser in which relatively high efficacy may be achieved. For example, a semiconductor laser configured in combination with a fiber may have efficacy on the order of 26 lumens/watt. Such lasers may be used, for example, for projection systems. Relatively high efficacy may be achieved due to the relatively low beam divergence (e.g. 15 degrees) of the laser, and the absence of heat generation at projector light valves. Thus, a 5000 lumen projector may require about 20 watts of laser light from three primary colors (e.g. approximately 10 watts in green, 7 watts in red, and 3 watts in blue), or about 50 watts from an electrical plug. In comparison, a conventional projection light source may require about 1 kW.

Visible laser light (e.g. Red, Green, and Blue) may be generated by a configuration which provides frequency conversion with relatively high efficiency. A doped fluoride fiber may be used for frequency conversion. FIG. 2(a) shows a cross-section of a fluoride fiber. The fiber includes cladding 210 and core 220. The core may be doped, for example, with 1000 to 5000 ppm of erbium ($Er^{2+}$). FIG. 2(b) is an $Er^{2+}$ energy diagram. Frequency up-conversion takes place when input IR (Infra Red) light of wavelength 970 nm is coupled into the fiber core. The energy of the IR light at 970 nm is absorbed by the erbium, producing green light at 544 nm by a "two photon" absorption process. A "two photon" process is one by which an electron in an Er atom absorbs a photon and is excited to a higher-energy intermediate level. If the lifetime of the electron in this intermediate level is long enough (e.g. microseconds to milliseconds) the electron may absorb another IR photon and is again excited to a still higher level. The electron may then thermally decay from the higher energy level to a state from which a transition to the ground state is allowed. Dropping to the ground state the electron emits a photon with approximately twice the energy of the input IR light (or energy with wavelength of approximately half the wavelength of the input IR light). For example, in the case of Er doping, the absorption of IR light at 970 nm results in the emission of a green light at 544 nm.

FIG. 2(c) is a block diagram of a single-pass optical system for generating green light from an Er-doped fluoride fiber laser pumped by an IR source. The optical system of FIG. 2 includes: a substantial reflector 250, reflecting nearly 100% of green light (e.g. light at 544 nm); a length of doped fiber 260; and a partial reflector 270, partially reflecting (e.g. 10–30%) green light and partially transmitting green light. At the input facet of the fiber IR light from a laser pump may be injected. The pump may be, for example, the laser pump of FIG. 1. Substantial reflector 250 may be, for example, a dichroic filter or a grating embedded near the input facet of the fiber. An optical cavity may be formed between substantial reflector 250, positioned at the input facet of fiber 260, and partial reflector 270, position at the output facet of fiber 260. Light at an IR frequency may excite the generation of green light in the fiber. Green light in the fiber may undergo multiple reflections between reflectors 250 and 270. When the input IR power exceeds a predetermined threshold, green laser emission may be obtained at the output facet of the fiber (i.e. at partial reflector 270). In these types of cavity structures having optical gain and feedback, lasing action may occur when pump power exceeds a threshold. Beyond the power threshold visible output may be substantially linear with pump input up to a saturation level of the fiber.

Various colors in the visible spectrum may be obtained by the choice of rare earth dopant for a fiber core. Table I shows some exemplary choices of dopants, pump wavelengths, and emission wavelengths. In particular, Table I shows choices of dopants and pump wavelengths to generate primary colors of the visible spectrum. For example, Table I shows that a fiber which is co-doped with Praseodymium and Ytterbium (Pr/Yb), may generate three primary colors, namely: Red (at 635 nm), Green (at 520 nm), and Blue (at 491 nm) by using a pump at 780–885 nm. Hence, it may be possible to construct an optical system which uses one pump and three respective sections of fluoride fiber each of appropriate respective length and with appropriate reflectors to generate Red, Green, and Blue visible light. This type of configuration may be desirable in the sense that one pump may be used to generate, for example, all the colors for a projection system or white light for other applications, such as, automobile lighting. As will be discussed below, it may also be possible to configure such an optical system to generate white light (broad band visible light) using a single fiber.

TABLE I

| Rare Earth | Pump Wavelength (nm) | Laser Wavelength (nm) | Dopant concentration (ppm) |
|---|---|---|---|
| Er | 801 | 544, 546 | 1000 |
|  | 970 | 544, 546 | to |
| Ho | 643–650 | 547–549 | 5000 |
| Nd | 582–596 | 381, 412 |  |
| Pr | 476.5 | 610, 635, 695, 715, 885, 910 |  |
|  | 1,010 + 835 | 491, 520, 605, 635 |  |
| Pr/Yb | 780–885 | 491, 520, 605, 635 |  |
| Tm | 647.1, 676.4 | 455, 480 |  |
|  | 1064 + 645 | 455 |  |
|  | 1112, 1116 | 480, 650 |  |
|  | 1114–1137 | 480 |  |

The single-pass fiber laser structure shown in FIG. 2(c), however, may not be efficient for converting input IR light into light at visible frequencies because input IR light is pumped at only one end. The energy supplied by the pump may decay over distance in the fiber, and hence the gain along the length of the fiber may be non-uniform. Due to insufficient pumping, conversion efficiency may be reduced causing absorption of emission light in regions of the fiber that are below the power threshold. Increasing pump input energy to maintain a power threshold at all point along the fiber may not solve this problem because unused pump energy may be transmitted at the output end together with visible light.

To obtain relatively high IR to visible light conversion efficiency, it is desirable to provide means of pumping at both ends (bi-directional pumping) of the fiber and using substantially all the pump light energy for conversion (up conversion or down conversion). Bi-directional pumping arrangements converting substantially all available pump light to output laser light may be achieved using, for example, diamond SLD pump 100 of FIG. 1. Although the discussion below relates to visible output by up-conversion in fibers, one of ordinary skill in the art will recognize that these types of configurations may also be used for down-conversion in fibers as well as for frequency conversion in crystals and polymers.

FIG. 3 is a block diagram of an optical system for generating light using bidirectional pumping in accordance with an embodiment of the present invention. The optical system of FIG. 3 includes: pump 340, pump 350, length of fiber 320, substantial reflector 310, and partial reflector 330. Pumps 340 and 350 may be, for example, diamond SLD pumps, such as, pump 100 of FIG. 1. Fiber 320 may be, for example, a doped fluoride fiber. Substantial reflector (100% reflector) 310 may be, for example, an interference filter or a grating in the fiber designed to substantially reflect light at a particular wavelength (or frequency). Partial reflector 330 may be, for example, an interference filter or a grating in the fiber designed to partially reflect light at a particular wavelength (or frequency). Fiber 320 is configured with substantial reflector 310 at one facet, and partial reflector 330 at the other facet. Substantial reflector 310 and partial reflector 330 may both be designed to reflect light at a desired emission frequency of a doped fiber forming a cavity. Partial reflector 330 partially transmits light at a desired emission frequency of a doped fiber at an output facet. For example, reflectors 310 and 330 may be designed to reflect emitted green light at a wavelength of 544 nm of an Er-doped fluoride fiber or at a wavelength of 520 nm of a Pr/Yb doped fluoride fiber. Pumps 340 and 350 are coupled to fiber 320. Pump 340 may be coupled to the fiber adjacent to an input facet of the fiber, while pump 350 may be coupled to the fiber adjacent to an output facet of the fiber.

Pumps 340 and 350 may be coupled to fiber 320 by WDMs (Wavelength Division Multiplexers) 360 and 370, respectively. Alternatively, pump 340 may be coupled to fiber 320 by substantial reflector 310 adjacent to an input facet, as substantial reflector 310 may be made wavelength-selective. A reflector designed for a particular wavelength (or frequency) may transmit light at other wavelengths (or frequencies), including the wavelength of light injected by a pump. Therefore, light generated by a pump may be injected through a reflector, such as, substantial reflector 310. It is desirable to couple pump 350 adjacent to an output facet by a WDM.

A WDM is a wavelength-sensitive device that may be used to couple power at a specific wavelength (or frequency) to a fiber. It may be used to couple a pump supplying light energy to a fiber, at an input facet, or to transmit light out of a fiber, at an output facet. A WDM may be made by fusing fibers together so that their optical fields may interact via a fused cladding region. The fused cladding region enables light propagating in one fiber core to be coupled into the other. Maximum coupling may occur at a wavelength (or frequency) for which the propagation constant is the same for both fibers. Coupling occurs over a certain frequency range determined by the phase mismatch between the coupled fibers. Light from one fiber at a given wavelength may be coupled into another fiber when the interaction length (of the fused region) is equal to half the "beat length". Thus, a WDM may be designed to transmit substantially all light from one fiber to another over a specified bandwidth by adjusting the interaction length and the spacing between fiber cores.

Figure 4:
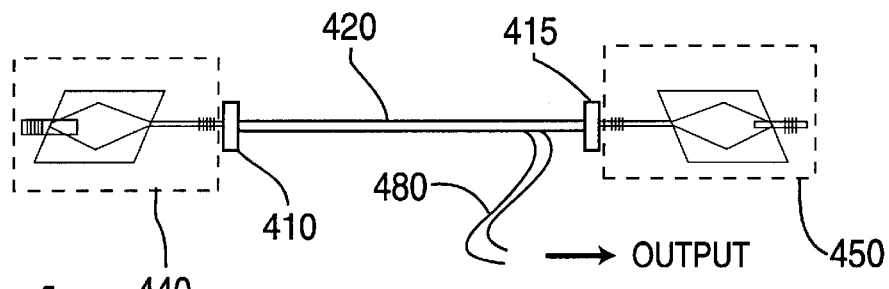
FIG. 4 is a block diagram of an optical system for generating light using bi-directional pumping in accordance with a second embodiment of the present invention.

FIG. 4 shows an alternative configuration to that of FIG. 3 in which fiber 420 is configured with two substantial reflectors. FIG. 4 shows substantial reflector 410, at one facet and substantial reflector 415, at the other facet. Light from pump 440 may be injected at one facet through substantial reflector 410, and light from pump 450 may be injected at the other facet through substantial reflector 415. Substantial reflector 410 and substantial reflector 415 may both be designed to reflect light at a desired emission frequency of a doped fiber forming a cavity. Output light may be transmitted by means of WDM 480 fused to fiber 420 adjacent to substantial reflector 415. Pumps 440 and 450 may be, for example, diamond SLD pumps, such as, pump 100 of FIG. 1. The configuration shown in FIG. 4 may be less costly to implement than that of FIG. 3 as only one WDM may be used.

Figure 5:
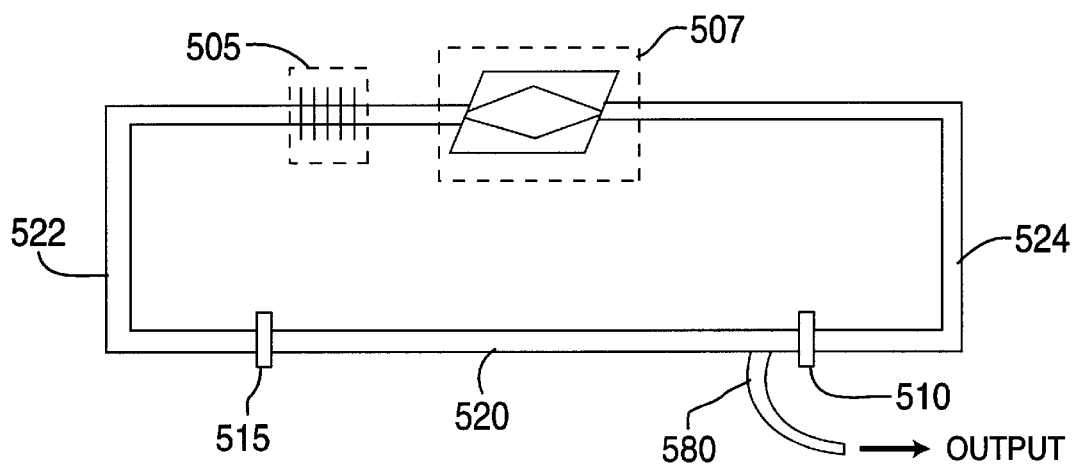
FIG. 5 is a block diagram of a ring optical system for generating light in accordance with a third embodiment of the present invention.

FIG. 5 shows a block diagram of a ring optical system for generating light in accordance with an embodiment of the present invention. A doped fiber laser may be embedded within an optical pump ring laser cavity. The ring optical system shown in FIG. 5 includes: gain medium (optical amplifier) 507, first fiber 524, second fiber 520, third fiber 522, fourth fiber 580, and substantial reflectors 510 and 514. Optionally, the ring optical system may also include bandpass filter 505. Gain medium 507, first fiber 524, second fiber 520, and third fiber 522, each has a first facet and a second facet. Gain medium 507 may be, for example, a diamond gain medium such as diamond structure 110 of FIG. 1. First and third fibers 524, and 522 may be for example, single mode fibers. Second fiber 520 may be, for example, a doped fluoride fiber. Substantial reflector 510, positioned at the first facet of second fiber 520, and substantial reflector 515, positioned at the second facet of second fiber 520, may both be designed to reflect light at a desired emission frequency of a doped fiber forming a cavity. The first facet of gain medium 507 may be coupled to the first facet of first fiber 524, and the second facet of gain medium 507 may be coupled to the second facet of third fiber 522. Substantial reflector 510 may couple the second facet of first fiber 524 to the first facet of second fiber 520, and substantial reflector 515 may couple the first facet of third fiber 522 to the second facet of second fiber 520. Therefore, a ring (gain medium, first fiber, second fiber, third fiber, gain medium) is formed. Output light may be transmitted by fourth fiber 580 fused to second fiber 520 adjacent to substantial reflector 510. Fourth fiber 580 may be, for example, a WDM.

IR light from gain medium 507 may flow in opposite directions in second fiber (visible fiber laser) 520 to provide double pumping. Substantial reflectors 510 and 515 may form a cavity together with second fiber 520, while transmitting IR light into second fiber 520. Fourth fiber 580 may be a WDM coupler used to remove a portion of visible light and provide the light as output. In comparison to pump 100 of FIG. 1, it is possible not to use reflectors for IR light in conjunction with gain medium 507. IR light emitted from the first facet of gain medium 507 flows through an IR loop (ring), may be partly absorbed by second fiber 520, and may reenter gain medium 507 at the second facet. IR light emitted from the second facet of gain medium 507 is re-injected at the first facet after passage through and partial absorption by second fiber 520. Re-injected light at the first and second facets of gain medium 507 may create the feedback for IR laser oscillation.

Optionally, the second facet of third fiber 522 may be coupled to gain medium 507 through bandpass filter 505. Bandpass filter 505 may be added to tune the IR light wavelength (or frequency) to a desired value. The arrangement of FIG. 5 may be thought of, for example, as a visible fiber laser within a cavity of an IR diamond "ring" laser. In such an arrangement, a visible fiber laser may act as an output load of an IR laser. Substantially all IR light emitted may be absorbed by second fiber (fiber laser) 520 and used for (up-)conversion. Unused IR light may be re-circulated through the ring and re-amplified by feedback and the laser mechanism. Theoretically, this type of structure may achieve 100% conversion efficiency. Practically, some IR energy loss may be expected due to coupling inefficiencies between an SLD diamond gain medium and a single mode fiber. For a diamond structure with a SLD (e.g. diamond structure 110 of FIG. 1), implemented with a mode expander, fiber coupling efficiency at each end may be on the order of 90%, and a total fiber coupling efficiency of about 81% may result for both SLD ends. Other conventional frequency conversion schemes may have conversion efficiencies of less than 20%.

Consider, for example, a single-pass up-conversion fiber laser such as the configuration shown in FIG. 2(c). Suppose fiber 260 is a Pr/Yb doped fluoride fiber giving red (635 nm), green (520 nm), and blue (491 nm) fluorescence when pumped by IR laser light at 850 nm. Following proper excitation, the amount of fluorescence (fluorescence efficiency) at each of these wavelength may be determined by the lifetime of respective intermediate energy levels and "transition probabilities" to "ground state". For a given pump, a red output laser may be obtained by using end reflectors for a red wavelength (or frequency), a green output laser may be obtained by using end reflectors for a green wavelength (or frequency), and a blue output laser may be obtained by using end reflectors for a blue wavelength (or frequency). Assume the fluorescence efficiency is relatively high for red wavelengths, moderate for green wavelengths, and relatively low for blue wavelengths. For a given pump, supplying a given amount of power, and for a fiber of given length, the configuration of FIG. 2 yields IR to visible light conversion efficiency in accordance with the fluorescence efficiency. In this case, using the configuration of FIG. 2, a substantial amount of IR energy may be wasted for making a blue laser. With the configuration of FIG. 5, a red, green, and blue light generating laser may also be obtained by designing reflectors to provide reflection (feedback) at red, green, and blue wavelength (or frequency) respectively. In the configuration of FIG. 5, however, IR to visible light conversion efficiency may theoretically be 100% for red, green, and blue frequencies. Low florescence may have some effect on the configuration of FIG. 5. Due to low florescence a laser, in the configuration of FIG. 5, may have a certain rise time, while building up to full power.

Figure 6:
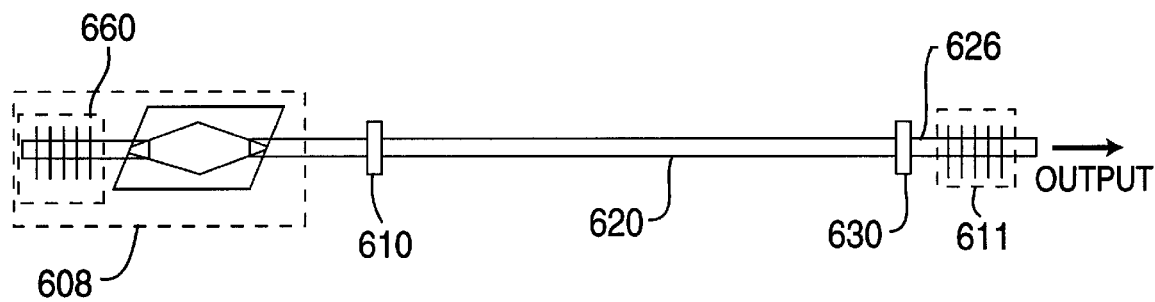
FIG. 6 is a block diagram of an optical system for generating light in accordance with a fourth embodiment of the present invention.

FIG. 6 is a block diagram of an optical system for generating light in accordance with an embodiment of the present invention. The optical system for generating light shown in FIG. 6 includes: pump 608, first fiber 620, second fiber 626, first substantial reflector 610, partial reflector 630, and second substantial reflector 611. Pump 608 may be, for example, laser 100 of FIG. 1 excluding partial reflector 170 at the output. Note that substantial reflector 660 may be included in pump 608. First fiber 620 and second fiber 626 each have a first facet and a second facet. First fiber 620 may be, for example, a doped fluoride fiber. Second fiber 626 may be, for example, a single mode fiber. First substantial reflector 610 and second substantial reflector 611 may each be, for example, an interference filter or a grating in the fiber designed to substantially reflect light at a particular wavelength (or frequency). Partial reflector 630 may be, for example, an interference filter or a grating in the fiber designed to partially reflect light at the particular wavelength (or frequency). First fiber 620 is configured with first substantial reflector 610 at the first facet, and partial reflector 630 at the second facet. Substantial reflector 610 and partial reflector 630 may both be designed to reflect light at a desired emission frequency of a doped fiber forming a cavity. Partial reflector 630 partially transmits light at a desired emission frequency of a doped fiber at an output facet. Pump 608 may be coupled to the first facet of first fiber 620 by first substantial reflector 610. Pump 608 may inject light at a first frequency through substantial reflector 610. The second facet of first fiber 620 may be coupled to the first facet of second fiber 626 by partial reflector 630. Second substantial reflector 611 may be positioned at the second facet of second fiber 626. Substantial reflectors 660 and 611 may be designed to substantially reflect light at an IR or first frequency, and transmit light at other frequencies. Substantial reflector 610 and partial reflector 630 may be designed to reflect light at a desired emission frequency of doped fiber (or second frequency) 620, and transmit light at other frequencies (i.e. pass IR light). Note that a fiber amplifier such as, for example, first substantial reflector 610, first fiber 620, and partial reflector 630, maybe embedded in a pump.

In the configuration of FIG. 6 substantially all IR light injected by pump 608 may be used for frequency conversion, as first fiber 620 lies inside a cavity for IR light formed by second substantial reflector 611 and substantial reflector 660. Substantially all IR energy may be absorbed by second fiber 620 (visible fiber) acting as an IR loss mechanism for frequency conversion. In this case, the IR cavity is linear (Fabry-Perot type). Further, strong fluorescence at wavelengths other than a desired lasing wavelength may not impair the performance at the desired lasing wavelength. Although fluorescence may occur at other wavelengths, the effective gain at a wavelength for which feedback is provided (i.e. a desired lasing wavelength) may be relatively high (theoretically infinite). A fiber may glow at wavelengths other than a desired wavelength, but most of the power may be obtained at a desired lasing wavelength at an output end. Hence, despite fluorescence at other wavelengths, the IR to fiber laser conversion efficiency remains relatively high, for example, 75%–100%. Table II shows a power distribution for a projection system in which a 75% conversion efficiency, including fiber coupling efficiency, and 24% electrical to optical plug efficiency, are assumed. Such a projector may consume only 10 watts of electrical power, compared with about 200 watts for a conventional projector with the same light output power.

TABLE II

|  | Red | Green | Blue | White |
| --- | --- | --- | --- | --- |
| Up-conversion laser output | 0.6 Watts | 0.3 Watts | 0.8 Watts | 1.8 Watts |
| SLD/fiber pump output | 0.9 Watts | 0.4 Watts | 1.1 Watts | 2.4 Watts |
| Plug power | 4 Watts | 2 Watts | 4 Watts | 10 Watts |

Figure 7:
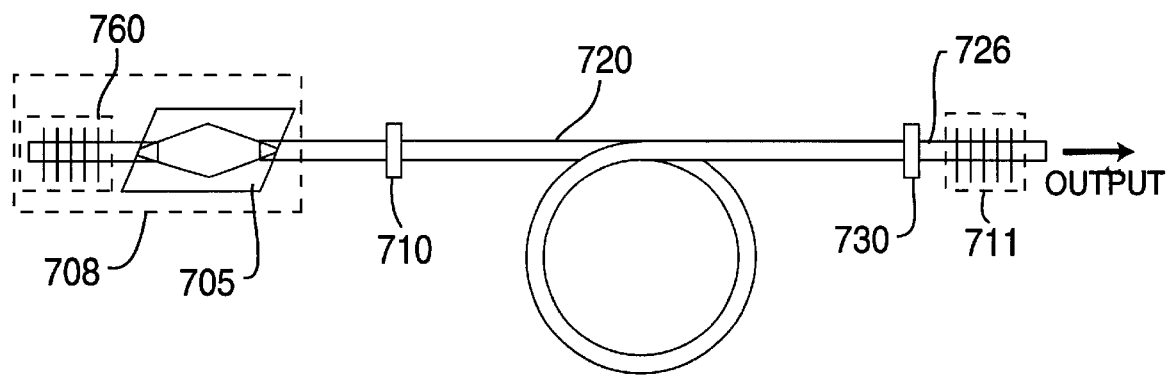
FIG. 7 is a block diagram of an optical system for generating light in accordance with a fourth embodiment of the present invention.

An optical system as described in the foregoing may be made relatively compact. FIG. 7 is a block diagram of an optical system for generating light in accordance with an embodiment of the present invention. The optical system for generating light shown in FIG. 7 is identical to the optical system of FIG. 6 and includes: pump 708, first fiber 720, second fiber 726, first substantial reflector 710, partial reflector 730, and second substantial reflector 711. Pump 708 may be, for example, laser 100 of FIG. 1 excluding partial reflector 170 at the output. Note that substantial reflector 760 may be included in pump 708. Diamond SLD structure 705 included in pump 708 may be a semiconductor chip with dimensions on the order of 2 mm×4 or 5 mm. Fiber 720 may be on the order of two meters in length. Savings in package size may be obtained by coiling Fiber 720 as illustrated in FIG. 7.

A Praseodymium-doped fiber may function as an optical amplifier at 1310 nm when pumped by a 980 nm laser. Optical frequency up-conversion is also possible, however, when pumping at other wavelengths. A praseodymium-doped fluoride fiber, for example, may be used for up-conversion when pumped simultaneously at two wavelengths (or frequencies). In particular, pumping such a fiber at infra-red (IR) wavelengths of 840 nm and 1020 nm may produce fluorescence in a praseodymium-doped fluoride fiber at 490 nm, 520 nm, 605 nm, and 635 nm. Light with at a wavelength of 490 nm is blue, 520 nm is green, and 635 nm is red. The combination of these colors (i.e. red, green, and blue) may produce white light. Thus, doped fluoride fibers may be used to make relatively low divergence angle (i.e. less than 20°) white light sources which, because the light is generated by fluorescence, do not exhibit speckle. In addition, a co-doped fluoride fiber (e.g. a Praseodymium-Ytterbium fluoride fiber) may be pumped at a single wavelength. For example, a Praseodymium-Ytterbium fluoride fiber may be pumped with light having a wavelength of 850 nm or a wavelength of 976 nm. Pumping a doped fluoride fiber at a single wavelength may be used to produce fluorescence in the doped fiber at red, green, and blue wavelengths (i.e. producing all three primary colors).

Figure 8A:
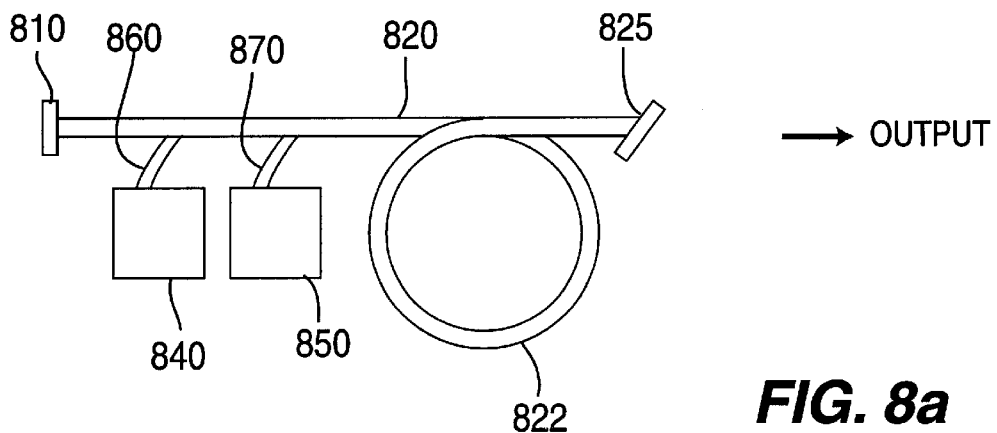
FIGS. 8(a) and 8(b) are block diagrams of optical systems with broad emission spectrum in accordance with a fifth embodiment of the present invention.
Figure 8B:
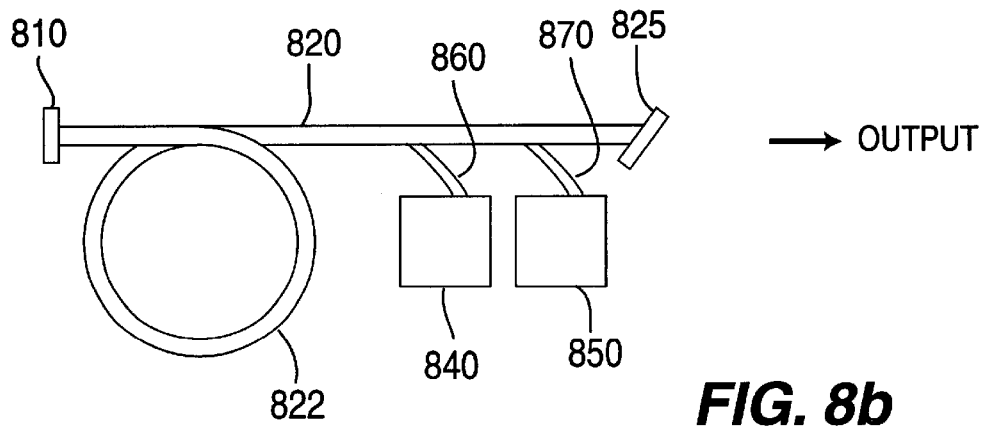

FIGS. 8(a) and 8(b) are block diagrams of optical systems with broad emission spectra in accordance with an embodiment of the present invention. Both the system shown in FIG. 8(a) and the system shown in FIG. 8(b) include: pump 840, pump 850, length of fiber 820, and substantial reflector 810. Pumps 840 and 850 may be, for example, diamond SLD pumps, such as, pump 100 of FIG. 1. Fiber 820 may be, for example, a doped fluoride fiber, such as a praseodymium-doped optical fiber. Fiber 820 may be a few meters long (e.g. 2 meters), but fiber 820 may be coiled into a 1–2 inch diameter coil. A first facet of fiber 820 may be, for example, cleaved perpendicular to the fiber core and mirrored to act as substantial reflector 810. Second facet 825 of fiber 820 may be ground and polished at an angle of 8–12°. In addition, an anti-reflection coating may be applied to second facet 825 to minimize reflection losses. The angled polish of second facet 825 of fiber 820 helps to prevents reflection back into the fiber core. In this manner, light generated and propagated in the fiber core may be transmitted without forming a laser cavity. When no laser cavity is formed no particular frequency of light is selected. Thus, the optical systems of FIGS. 8(a) and 8(b) may be used as broad band light source.

The optical system of FIG. 8(a) employs co-directional pumping, while the optical system of FIG. 8(b) employs contra-directional pumping. In the optical systems of both FIGS. 8(a) and 8(b) pumps 840 and 850 may be coupled to fiber 820 by WDMs 860 and 870, respectively. In FIG. 8(a) coiled portion 822 of fiber 820 is positioned between WDMs 860 and 870, (coupling pumps 840 and 850, respectively, to fiber 820) and second (ground) facet 825. Whereas in FIG. 8(b) coiled portion 822 of fiber 820 is positioned between substantial reflector 810 and WDMs 860 and 870, (coupling pumps 840 and 850, respectively, to fiber 820). In FIG. 8(a) pumping light sources 840 and 850 and superfluorescent light, generated in fiber 820, may be designed to propagate in the same direction. Whereas in FIG. 8(b) pump light may be injected from a position adjacent to an output end of fiber 220 through WDMs 860 and 870. Contra-directional pumping, as shown in FIG. 8(b) may be more efficient then co-directional pumping, because light which may not generate fluorescence in fiber 820 in the backward direction may be reflected by substantial reflector 810 and then used for additional pumping in the forward direction.

Fiber 820 may be pumped by pump 840 with light at a wavelength of, for example, 840 nm and, by pump 850, at a wavelength of, for example 1020 nm. Fiber 820 may then act as a traveling wave amplifier in which amplified light may be guided along the fiber core. Thus, output power may be a function of pumping light energy and the fiber length. In addition, the divergence pattern of the output beam may be determined by the numerical aperture of fiber 820. Depending on the type of fiber used, the output beam may occupy a cone of less than 20°. Light having such a divergence pattern may be collected in a condenser lens.

Light produced by a light source having a configuration as shown in FIGS. 8(a) and 8(b) is similar to light produced by a superluminescent diode. In other words, light produced may be broad-band, and free from speckle noise often encountered in laser light. In conventional laser projection systems, means such as a high frequency modulator, or a random phase diffuser may be used to attenuate speckle noise. In a projection system according to the present invention, however, such means may not be necessary.

Figure 9A:
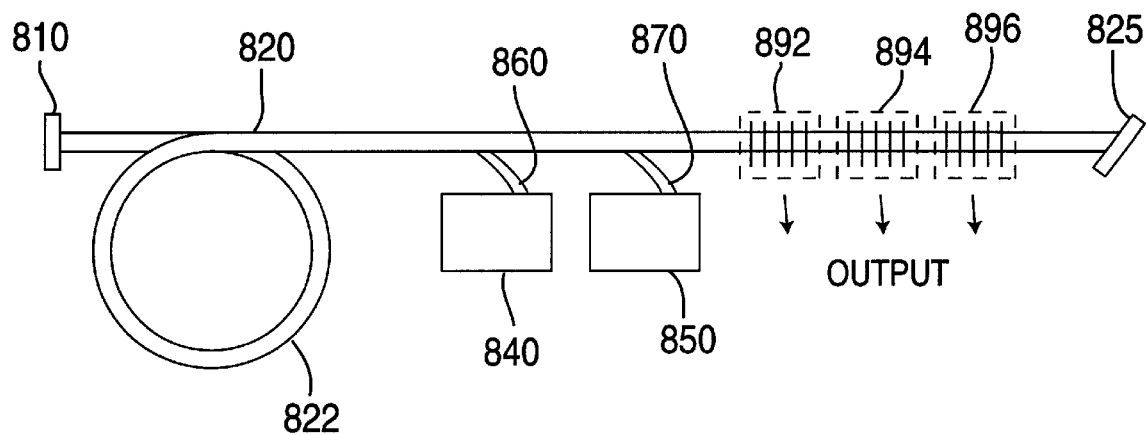
FIGS. 9(a) and 9(b) are block diagrams of optical systems for generating light in accordance with a sixth embodiment of the present invention.
Figure 9B:
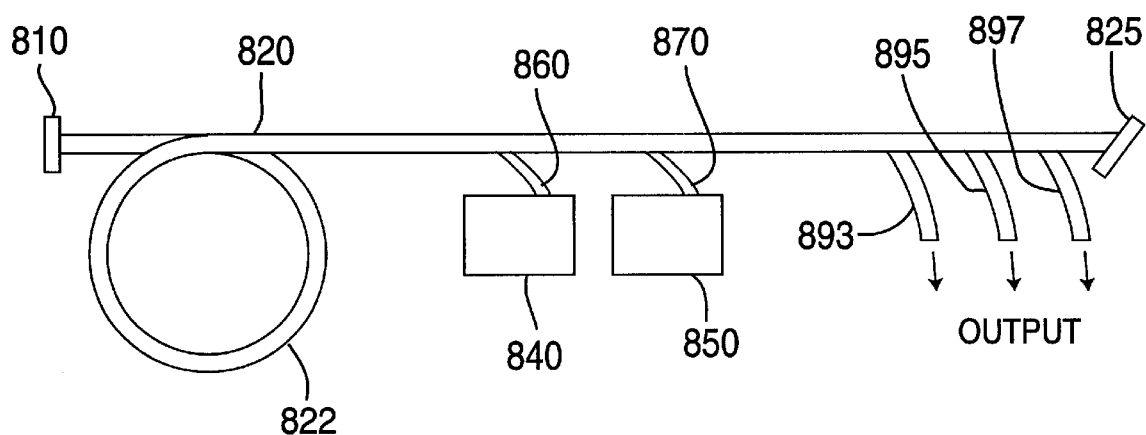

FIGS. 9(a) and 9(b) are block diagrams of optical systems for generating light in accordance with an embodiment of the present invention. The configuration shown in FIGS. 9(a) and 9(b) employ contra-directional pumping as in FIG. 8(b). The optical system of FIG. 9(a) includes diffraction gratings 892, 894, and 896, in addition to pump 840. pump 850, length of fiber 820, substantial reflector 810, WDMs 860 and 870, and coiled portion 822. Fiber 820 may be, for example, a doped fluoride fiber, such as a praseodymium-doped optical fiber. Fiber 820 may be pumped by pump 840 with light at a wavelength of, for example, 840 nm and, by pump 850, at a wavelength of, for example 1020 nm. Diffraction gratings 892, 894, and 896 may be formed in fiber 820. The configuration of FIG. 9(a) may be used to generate light at a particular frequency (or frequencies) by separating broad band (or white) light into, for example, red, green, and blue components. Diffraction gratings 892, 894, and 896 may be used to separate broad band light into, for example, red (e.g. light at a wavelength of 635 nm), green (e.g. light at a wavelength of 520 nm), and blue (e.g. light at a wavelength of 490 nm), components, respectively. The optical system of FIG. 9(b) includes WDMs 893, 895, and 897, in addition to pump 840, pump 850, length of fiber 820, substantial reflector 810, WDMs 860 and 870, and coiled portion 822. The configuration of FIG. 9(b) may be used to generate light at a particular frequency (or frequencies) by separating broad band (or white) light into, for example, red, green, and blue components. WDMs 893, 895, and 897 may be used to separate broad band light into, for example, red, green, and blue, components, respectively. As beam divergence patterns from fibers may be determined by the numerical aperture of the fiber, using WDM filters 893, 895, and 897 for the separating light components may be advantageous. Hence, using WDM filters 893, 895, and 897 may yield relatively high collection efficiency (theoretically more than 90% efficiency).

Although the arrangements shown in FIGS. 9(a) and 9(b) employ contra-directional pumping, one of ordinary skill in the art will recognize that these types of configurations may be modified to employ co-directional pumping.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

The invention claimed is:

1. An optical system for generating light comprising:
   a superluminescent diode that generates light having a predetermined wavelength;
   a doped optical fiber, having a first facet and a second facet, the doped fiber coupled to the superluminescent diode, for providing an optical path and for converting energy of light having the predetermined wavelength to light having first and second other wavelengths, each of the other wavelengths being less than the predetermined wavelength;

first and second reflectors, positioned proximate to the first facet of the doped optical fiber, for selectively reflecting light having said first and second other wavelengths, respectively; and third and fourth reflectors, positioned proximate to the second facet of the doped optical fiber, for selectively reflecting light having said first and second other wavelengths, respectively.

2. The optical system of claim 1, further comprising an other superluminescent diode, coupled to the doped optical fiber, for generating light having the predetermined wavelength, wherein the doped optical fiber is coupled to the superluminescent diode by a WDM (wavelength division multiplexer) adjacent to the first facet and the doped optical fiber is coupled to said other superluminescent diode by an other WDM adjacent to the second facet.

3. The optical system of claim 1, wherein the first and second reflectors substantially reflect light having said first and second other wavelengths and the third and fourth reflectors partially reflect and partially transmit light having said first and second other wavelengths.

4. The optical system of claim 1, wherein the doped optical fiber is a fluoride fiber doped with a dopant, the dopant being fluorescent to produce light having said first and second other wavelengths by a two-photon process when excited by light having the predetermined wavelength.

5. An optical system for generating light comprising:

an optical pump for generating light having a predetermined wavelength;

a doped optical fiber, having a first facet and a second facet, the doped fiber coupled to the optical pump, for providing an optical path and for converting energy of light having the predetermined wavelength to light having first and second other wavelengths, each of the first and second other wavelengths being less than the predetermined wavelength;

first and second reflectors, positioned proximate to the first facet of the doped optical fiber, for selectively reflecting light having said first and second other wavelengths;

third and fourth reflectors, positioned proximate to the second facet of the doped optical fiber, for selectively reflecting light having said first and second other wavelengths; and first and second other optical fibers fused to the doped optical fiber adjacent to the second facet for outputting light at said first and second other wavelengths, respectively, wherein the optical pump is coupled to the doped optical fiber via the first reflector, and the first and third reflectors substantially reflect light having said first other wavelength and substantially transmit light having the predetermined wavelength, and the second and fourth reflectors substantially reflect light having said second other wavelength and substantially transmit light having the predetermined wavelength.

6. The optical system of claim 5, wherein said first and second other fibers form respective WDMs (wavelength division multiplexers).

7. An optical system for generating light comprising:

a superluminescent diode for generating light having a predetermined wavelength;

a doped optical fiber, having a first facet and a second facet, for providing an optical path and for converting energy of light having the predetermined wavelength to light having first and second other wavelengths, each of the first and second other wavelengths being less than the predetermined wavelength, the second facet of the doped optical fiber being ground at an angle; and first and second reflectors, positioned proximate to the first facet of the doped optical fiber, for coupling the superluminescent diode to the doped optical fiber and for substantially reflecting light having said first and second other wavelengths.

8. The optical system of claim 7, wherein the doped optical fiber includes a coiled portion.

9. The optical system of claim 7, wherein the light having the predetermined wavelength is infra-red light and the light of the first and second other wavelengths are components of multiple light wavelengths produced in the doped optical fiber, the combination of the multiple light wavelengths forming broad band visible light which is emitted at the second facet of the fiber.

10. The optical system of claim 7, wherein the second facet of the doped optical fiber is polished and coated with an anti-reflecting material.

11. An optical system for generating light comprising:

a first superluminescent diode for generating light having a first wavelength;

a second superluminescent diode for generating light having a second wavelength;

a doped optical fiber, having a first facet and a second facet, the doped optical fiber coupled to the first super luminescent diode and the second superluminescent diode, for providing an optical path and for converting energy of light having the first wavelength and energy of light having the second wavelength to light having third and fourth wavelengths by a two photon process, each of the third and fourth wavelengths being less than first and second wavelengths, the second facet of the fiber being ground at an angle; and first and second reflectors, positioned at the first facet of the doped optical fiber, for substantially reflecting light having the third and fourth wavelengths, respectively.

12. The optical system of claim 11, wherein the doped optical fiber is coupled to the first superluminescent diode by a first WDM (wavelength division multiplexer) and the doped optical fiber is coupled to the second superluminescent diode by a second WDM, the second WDM positioned adjacent to the first WDM.

13. The optical system of claim 11, wherein the light having the first and second wavelengths is infra-red light and the light of the third and fourth wavelengths are components of multiple light wavelengths produced in the doped optical fiber, the combination of the multiple light wavelengths forming broad band visible light which is emitted at the second facet of the fiber.

14. The optical system of claim 11, wherein the second facet of the doped optical fiber is polished and coated with an anti-reflecting material.

15. The optical system of claim 11, wherein the first wavelength is equal to the second wavelength.

16. The optical system of claim 12, wherein the doped optical fiber includes a coiled portion positioned between the first and second WDMs and the second facet of the doped optical fiber.

17. The optical system of claim 12, wherein the doped optical fiber includes a coiled portion positioned between the first and second WDMs and the first and second reflectors.

18. An optical system for generating light comprising:

a superluminescent diode, having a gain medium, that generates light having a predetermined wavelength;

a doped optical fiber, having a first facet and a second facet, the doped fiber coupled to the optical pump, for providing an optical path and for converting energy of light having the predetermined wavelength to light having first and second other wavelengths, each of the first and second other wavelengths being less than the predetermined wavelength;

first and second reflectors, positioned proximate to the first facet of the doped optical fiber, for selectively reflecting light having said first and second other wavelengths, respectively; and third and fourth reflectors, positioned proximate to the second facet of the doped optical fiber, for selectively reflecting light having said first and second other wavelengths, respectively;

wherein the gain medium of the superluminescent diode is coupled to the doped optical fiber between the second reflector and the third reflector.

* * * * *